United States Patent [19]
Qian et al.

[11] Patent Number: 5,565,074
[45] Date of Patent: Oct. 15, 1996

[54] PLASMA REACTOR WITH A SEGMENTED BALANCED ELECTRODE FOR SPUTTERING PROCESS MATERIALS FROM A TARGET SURFACE

[75] Inventors: Xue Y. Qian, Milpitas; Arthur H. Sato, Santa Clara, both of Calif.

[73] Assignee: Applied Materials, Inc., Santa Clara, Calif.

[21] Appl. No.: 508,118

[22] Filed: Jul. 27, 1995

[51] Int. Cl.$^6$ .................................................. C23C 14/34
[52] U.S. Cl. ................................ 204/298.08; 204/298.12; 204/298.34; 156/345
[58] Field of Search ...................... 204/298.06, 298.08, 204/298.12, 298.34; 156/345 P

[56] References Cited

U.S. PATENT DOCUMENTS

| | | | |
|---|---|---|---|
| 4,818,359 | 4/1989 | Jones et al. | 204/298.06 |
| 5,116,482 | 5/1992 | Setoyama et al. | 204/298.08 |

FOREIGN PATENT DOCUMENTS

| | | | |
|---|---|---|---|
| 2-156081 | 6/1990 | Japan | 204/298.08 |
| 2-156082 | 6/1990 | Japan | 204/298.08 |

*Primary Examiner*—Aaron Weisstuch
*Attorney, Agent, or Firm*—Michaelson & Wallace; Pete Sgarbossa, Esq.

[57] ABSTRACT

A plasma reactor for processing a semiconductor substrate within a reactor chamber with a process gas from which a plasma has been formed in the chamber by electromagnetic excitation includes a sputter target in the chamber and overlying the wafer, the sputter target having additive material for the plasma, and a sputter excitation electrode overlying the target surface, the sputter excitation electrode having plural conductive segments separated by apertures therebetween, selected ones of the plural conductive segments being excited by an RF signal of a given phase and other of said plural conductive segments being excited by an RF signal of a different phase. Preferably, alternate segments are excited by RF signals of opposite phase, so that RF power radiated by alternate ones of the conductive segments is balanced by the RF power radiated by the remaining ones of the conductive segments. Preferably, segments excited by one phase are insulated from segments excited by the other phase.

34 Claims, 2 Drawing Sheets

PLASMA REACTOR WITH A SEGMENTED BALANCED ELECTRODE FOR SPUTTERING PROCESS MATERIALS FROM A TARGET SURFACE

BACKGROUND OF THE INVENTION

1. Technical Field

The invention is related to a plasma reactor for processing a semiconductor substrate or wafer, and in particular to a plasma reactor in which a process material, such as a passivation additive, is sputtered from a target surface within the reactor chamber.

2. Background Art

Plasma reactors for etching polysilicon thin films from a semiconductor wafer can employ halogen gases, for example, as a main etchant in the plasma. One problem is that such gases also tend to etch any silicon dioxide thin films on the wafer that may be exposed to the plasma, so that etch selectivity may be poor. It is known that this problem may be at least ameliorated if not completely solved by introducing into the plasma a passivation additive, such as an oxygen source like silicon dioxide, to reduce the etch rate of any silicon dioxide thin film on the wafer, without reducing the etch rate of the polysilicon thin film.

An additive material such as silicon dioxide may be introduced into the plasma by sputtering of a target surface containing the additive material (e.g., quartz) to be introduced into the plasma. It has recently been suggested that the sputter target surface may be located on or near the ceiling of the reactor chamber, and that the sputtering may be driven by an RF-excited electrode placed directly over the sputter target surface. The RF-excited electrode over the sputter target surface may be located inside the chamber or outside the chamber, but in either case must be relatively close to the sputter target surface. Thus, for example, the sputter target surface itself may be the chamber ceiling, while the RF-excited electrode may be located directly over the ceiling and therefore be outside of the chamber. Typically, the wafer is located directly below the ceiling on a wafer pedestal near the floor of the chamber. By varying the RF power applied to the RF-excited electrode, the silicon dioxide deposition rate on a wafer can be controllably varied within a range between zero and seventy Angstroms per minute.

One problem posed by having an RF-excited electrode over the sputter target surface on or near the ceiling is that the RF-excited electrode will cause a significant amount of capacitively coupled current to flow either to the chamber walls or down to the wafer near the chamber floor. Current flowing to the chamber walls will increase undesirable sputtering of the chamber walls. Current flowing to the wafer or wafer pedestal will increase ion bombardment damage of microelectronic devices on the wafer. A significant amount of RF power must be applied to the RF-excited electrode in order to produce sputtering of the target surface, so that the problem cannot be solved merely by reducing the RF power applied to the electrode.

An object of the present invention is to reduce or eliminate capacitively coupled currents to the wafer or wafer pedestal induced by the RF-excited electrode over the target surface. A related object of the invention is to reduce the range or depth of capacitive coupling from the RF-excited electrode into the reactor chamber so as to reduce the effect of the electrode on the plasma near the wafer and/or near the chamber walls.

SUMMARY OF THE DISCLOSURE

A plasma reactor for processing a semiconductor substrate within a reactor chamber with a process gas from which a plasma has been formed in the chamber by electromagnetic excitation includes a sputter target in the chamber and overlying the wafer, the sputter target having additive material for the plasma, and a sputter excitation electrode overlying the target surface, the sputter excitation electrode having plural conductive segments separated by apertures therebetween, selected ones of the plural conductive segments being excited by an RF signal of a given phase and other of said plural conductive segments being excited by an RF signal of a different phase. Preferably, alternate segments are excited by RF signals of opposite phase, so that RF power radiated by alternate ones of the conductive segments is balanced by the RF power radiated by the remaining ones of the conductive segments. Preferably, segments excited by one phase are insulated from segments excited by the other phase.

The advantage is that nearly all of the capacitive coupling from the electrode occurs within a range from the sputter excitation electrode roughly on the order of the width of the various conductive segments. Preferably, the separation between the sputter excitation electrode and the wafer or wafer pedestal is several times the characteristic width of the conductive segments, so that there is very little or no capacitive coupling between the sputter excitation electrode and the wafer.

Preferably, if the plasma reactor is of the type having an inductive coil antenna connected to a plasma source RF power supply, then the plural conductive segments of the sputter excitation electrode are sufficiently narrow to prevent the inducing by the inductive coil antenna of large eddy currents in the conductive segments.

In accordance with one embodiment, the plural conductive segments fan out radially from an apex of the ceiling overlying the center of the wafer pedestal. The plural conductive segments may be connected in groups to opposite phases of an RF signal. Alternatively, alternate ones of the plural conductive segments may be connected to the opposite phases of the RF signal.

In accordance with one implementation, the target surface is a quartz ceiling of the chamber and the sputter excitation electrode is a conductive pattern (either aluminum or copper, for example) deposited on the external top surface of the ceiling.

DETAILED DESCRIPTION OF THE PREFERRED EMBODIMENTS

Figure 1:
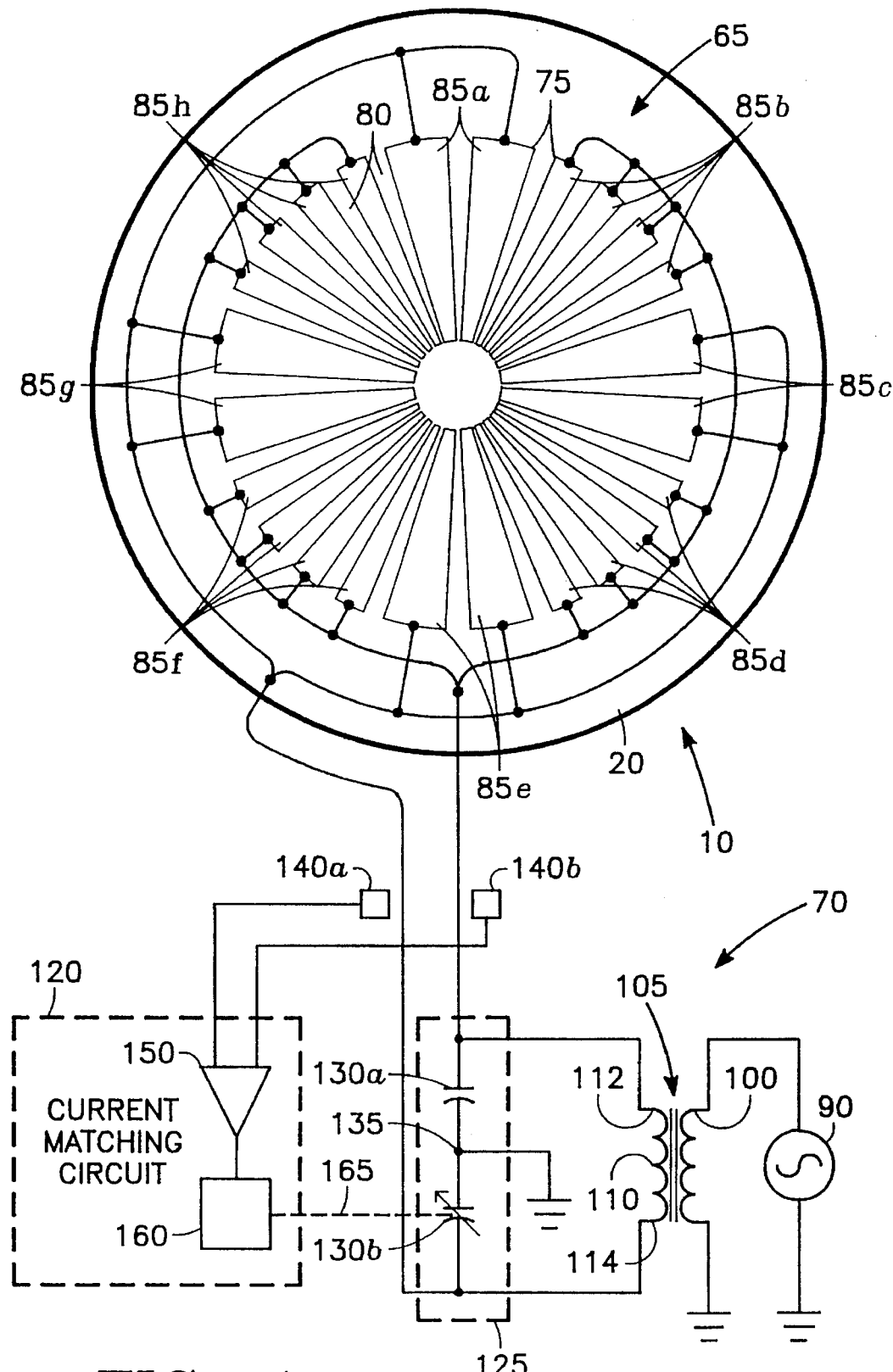
FIG. 1 is a top view of a plasma reactor including a sputter excitation electrode employed in carrying out one embodiment of the invention.
Figure 2:
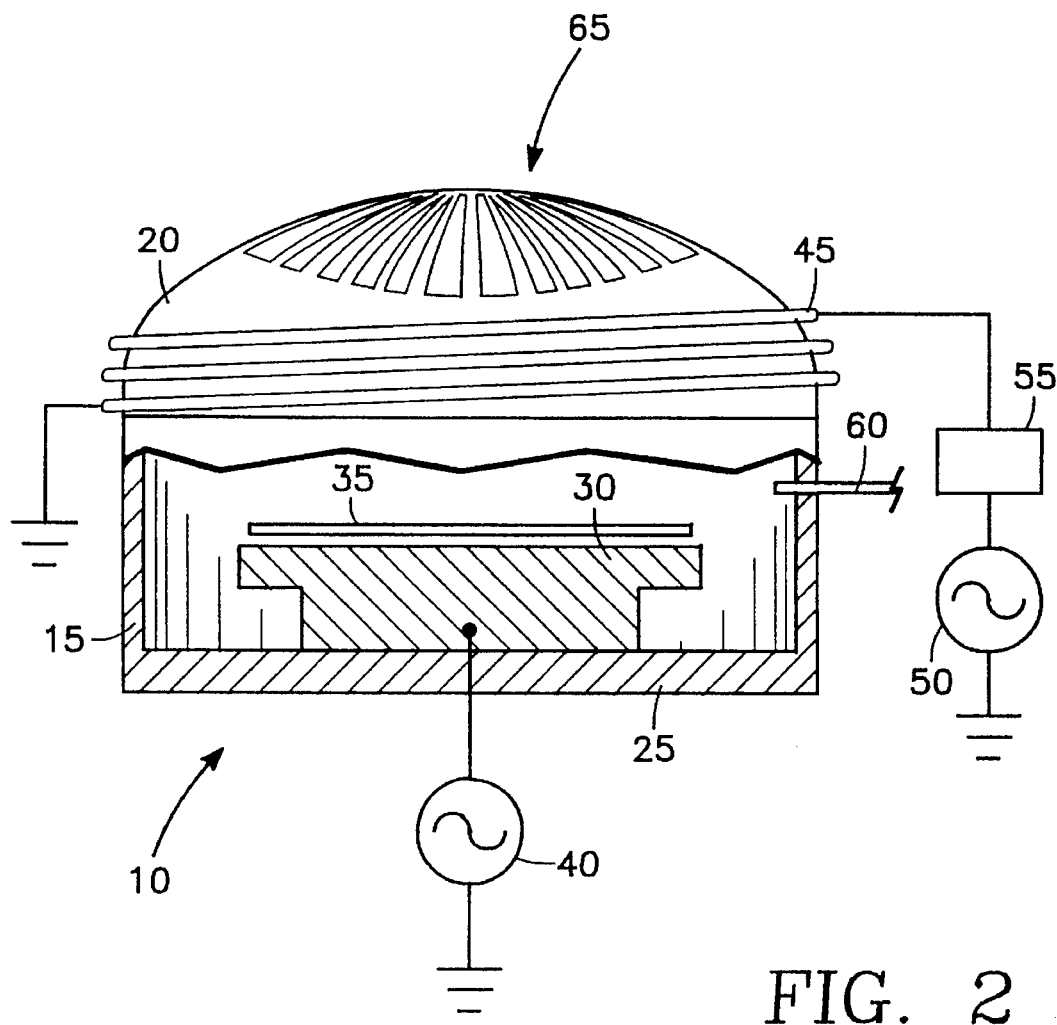
FIG. 2 is an elevational view of the plasma reactor of FIG. 1.

Referring to the top and side views of FIGS. 1 and 2, a plasma reactor has vacuum chamber 10 enclosed by a cylindrical side wall 15, a ceiling 20, and a bottom 25. While the ceiling may be of any suitable shape, in the embodiment of FIG. 2 it is dome-shaped. Within the chamber 10, a wafer pedestal 30 supports a semiconductor wafer 35 to be processed. The pedestal 30 may be connected to a bias RF power source 40 to precisely control the plasma ion energy at the top surface of the wafer 35 so as to optimize plasma process parameters while minimizing ion bombardment damage on the wafer surface. Although the present invention is useful in various types of plasma reactors, such as capacitively coupled plasma reactors, the plasma reactor of the embodiment of FIGS. 1 and 2 is an inductively coupled plasma reactor. Specifically, the plasma within the chamber 10 is ignited and maintained by RF power radiated from an inductive coil antenna 45 wound around the dome-shaped ceiling 20. A plasma source RF power supply 50 is connected through a conventional RF impedance matching circuit 55 to the inductive coil antenna 45. A process gas, such as chlorine, is introduced through a gas inlet 60 into the interior of the chamber 10.

A principal use of the invention is to introduce into the plasma atoms of an additive material to be deposited onto the wafer surface, for example as an etch passivation layer (such as silicon dioxide). A sputtering target is provided inside the chamber 10, preferably near the ceiling 20 and overlying the wafer pedestal 30. In the embodiment of FIGS. 1 and 2, the ceiling 20 itself is the sputtering target, and is made of the desired additive material (such as quartz). In order to induce sputtering of the target (e.g., the ceiling 20), a sputter excitation electrode 65 is placed on the top surface of the ceiling 20 and is coupled to a sputter excitation RF power source 70. As discussed previously herein, capacitive coupling between the sputter excitation electrode 65 and the wafer 35 increases the ion energy at the wafer surface. This interferes with the precision control over plasma ion energy at the wafer surface otherwise exercised by the bias RF power source 40, a significant problem.

In order to overcome this problem, the sputter excitation electrode 65 is divided into plural isolated segments 75. Adjacent segments are separated by apertures 80. At least two RF signals are applied to the electrode 65, different sets of the segments 75 receiving different ones of the two RF signals. In the embodiment illustrated in FIG. 1, there are eight separate sets 85a–85h of the electrode segments 75, alternate sets 85a, 85c, 85e, 85g receiving a first RF signal and the remaining sets 85b, 85d, 85f, 85h receiving a second RF signal of approximately equal magnitude but opposite phase relative to the first RF signal.

The different RF signals (e.g., the first and second RF signals of opposite phases) may be produced from a single RF signal by dividing it into two RF signals and then inverting one of them. Alternatively, the different RF signals may be produced from different RF sources. Preferably, however, the RF signals are of the same frequency and are synchronized.

The advantage of applying opposite phases of an RF signal to different segments 75 of the segmented excitation electrode 65 is that, even though sufficient RF power is coupled from the segmented excitation electrode 65 to the target or ceiling 20 to sputter it, very little or no power is capacitively coupled from the segmented excitation electrode 65 to the wafer or wafer pedestal 30. This feature prevents power from the excitation electrode 65 from interfering with the plasma processing of the wafer. Sufficient RF power is applied to sputter the target or ceiling 20 because respective areas or zones of the ceiling 20 are very near respective ones of the segments 75 of the excitation electrode 65 and therefore receive, predominantly, the RF power radiated by the respective segment 75. Little or no RF power is coupled to the wafer or wafer pedestal 30 because the wafer pedestal 30 is so far from the excitation electrode 65 that the wafer pedestal 30 is effectively equidistant from all excitation electrode segments 75 and therefore receives RF power from all of the segments 75 equally. Since equal numbers of the segments 75 radiate the same RF signal with opposite phases, the net RF power reaching the wafer and wafer pedestal 30 is zero, the opposing phases cancelling each other over the relatively long distance between the wafer and the segmented excitation electrode.

Nearly all of the capacitive coupling from the sputter excitation electrode 65 occurs within a range from the sputter excitation electrode roughly on the order of the average or characteristic width of the various conductive segments 75. Preferably, the separation between the sputter excitation electrode 65 and the wafer 35 or wafer pedestal 30 is several times the characteristic width of the conductive segments 75, so that there is very little or no capacitive coupling between the sputter excitation electrode 65 and the wafer 35 or pedestal 30.

Preferably, the plural conductive segments 75 of the sputter excitation electrode 65 are sufficiently narrow to prevent inducing by the inductive coil antenna 45 of large eddy currents in the conductive segments 75.

In the embodiment of FIGS. 1 and 2, the plural conductive segments 75 fan out radially from an apex of the dome-shaped ceiling 20 which overlies the center of the wafer pedestal 30. While the drawing of FIG. 1 shows the plural conductive segments 75 connected in sets or groups 85 to opposite phases of an RF signal, in an alternative embodiment, alternate ones of the plural conductive segments 75 may be connected to the opposite phases of the RF signal.

Preferably, the conductive segments are thin films of metal (such as copper or aluminum) deposited in a pattern onto the top surface of the ceiling 20.

The sputter excitation power source 70 produces two RF signals of opposite phases using a single RF power generator 90. The output of the generator 90 is connected to the primary winding 100 of a transformer 105 having a secondary winding 110. The two ends of the secondary winding 110 are the output terminals 112, 114 providing the two RF signals of opposite phases (i.e., signals which are 180 degrees out of phase).

As explained previously, there will be (theoretically, at least) no capacitive coupling to the wafer 35 if all of the capacitively coupled current produced by the electrode segment sets 85a, 85c, 85e, 85g connected to one phase is collected by the electrode segment sets 85b, 85d, 85f, 85h connected to the opposite phase, and vice versa. Such an ideal condition obtains only if the currents flowing through the two RF terminals 112, 114 of the secondary winding 110 are equal and opposite. Preferably, the RF source 70 includes a current matching circuit 120 and balance network 125 for artificially forcing the two currents to be equal and opposite, thereby providing as close an approximation as possible to the ideal condition described above.

The balance network consists of a pair of capacitors 130a, 130b connected across the secondary winding 110 and a ground tap 135 connected between the two capacitors 130a, 130b. The capacitor 130b is a variable capacitor and is controlled by the current matching circuit 120. The current matching circuit monitors the output of a pair of conventional current sensors 140a, 140b whose outputs are proportional to the currents through the terminals 112, 114, respectively. If the ideal condition obtains, the total current measured by the pair of sensors 140a, 140b is zero (i.e., two currents of equal magnitudes and opposite phases). The current matching circuit 120 is a conventional feedback circuit which varies the capacitance of the variable capacitor 130b so as to maintain the difference in magnitude of the outputs of the sensors 140a, 140b at zero or as close to zero as possible.

The general principle of the conventional feedback current matching circuit 120 is illustrated in FIG. 1, in which a differential amplifier 150 has two inputs connected to the outputs of the two current sensors 140a, 140b, respectively, and a servo 160 whose input is connected to the output of the differential amplifier 150. The servo 160 has a link 165 which varies the capacitance of the variable capacitor 130b. In the simplest implementation, the link 165 is mechanical and the variable capacitor is mechanically controlled by the link. In a more sophisticated implementation, the link 165 is electronic and the variable capacitor 130b is controlled electrically.

While the invention has been described with reference to a preferred embodiment employing only a pair of RF signals of opposite phase, a larger number (N) of RF signals of different (N) phases may be employed, different signals being applied to different electrode groups, there being at least N electrode groups.

While the invention has been described in detail by specific reference to preferred embodiments, it is understood that variations and modifications thereof may be made without departing from the true spirit and scope of the invention.

What is claimed is:

1. A plasma reactor for processing a semiconductor wafer substrate mounted on a pedestal within a reactor chamber with a process gas from which a plasma has been formed in the chamber by electromagnetic excitation, comprising:

a sputter target in the chamber, at least the surface of said sputter target including additive material for the plasma; and a sputter excitation electrode, the sputter excitation electrode having plural conductive segments separated by apertures therebetween, selected ones of the plural conductive segments being excited by an RF signal of a given phase and other ones of said plural conductive segments being excited by an RF signal of a different phase.

2. The reactor of claim 1 wherein said sputter target overlies the wafer substrate and wherein said sputter excitation electrode overlies the target surface.

3. The reactor of claim 1 further comprising a gas inlet for introducing a process gas comprising an etchant and wherein said target surface comprises an etch passivation material.

4. The reactor of claim 3 wherein said etchant comprises a halogen gas and wherein said etch passivation material comprises one of a class of oxygen-containing materials, said class including silicon dioxide.

5. The reactor of claim 1 wherein alternate groups of said segments are excited by RF signals of opposite phase, so that RF power radiated by alternate ones of the groups of conductive segments is balanced by the RF power radiated by the remaining groups of the conductive segments.

6. The reactor of claim 5 wherein segments excited by one phase are insulated from segments excited by the other phase.

7. The reactor of claim 1 wherein a separation between the sputter excitation electrode and the wafer substrate is several times the characteristic width of the individual conductive segments.

8. The reactor of claim 1 further comprising an inductive coil antenna connected to a plasma source RF power supply, and wherein the plural conductive segments of the sputter excitation electrode are sufficiently narrow to prevent the inducing by the inductive coil antenna of large eddy currents in the conductive segments.

9. The reactor of claim 1 wherein the plural conductive segments fan out radially from an apex of the ceiling of the reactor chamber overlying the center of the wafer pedestal.

10. The reactor of claim 1 wherein plural conductive segments are connected in different groups to opposite phases of an RF signal.

11. The reactor of claim 1 wherein alternate ones of the plural conductive segments are connected to opposite phases of an RF signal.

12. The reactor of claim 1 wherein said sputter excitation electrode and said wafer pedestal face opposite sides of said sputter target.

13. The reactor of claim 12 wherein:

said target surface is a ceiling of said chamber and comprises said additive material; and the sputter excitation electrode is a conductive pattern deposited on the exterior top surface of said ceiling.

14. The reactor of claim 13 wherein said additive material comprises silicon dioxide and said ceiling comprises quartz.

15. The reactor of claim 1 further comprising current matching means for maintaining approximately equal and opposite currents to said selected and other ones of said segments of said sputter excitation electrode.

16. The reactor of claim 15 further comprising a sputter excitation RF source for providing said RF signals of said given and different phases.

17. The reactor of claim 16 wherein said RF source comprises:

a RF generator;

a transformer having a primary winding connected to said RF generator and a secondary winding comprising a pair of terminals providing, respectively, said RF signals of said given and different phases and connected to different ones of said segments of said sputter excitation electrode.

18. The reactor of claim 17 further comprising current matching means for maintaining at least an approximate match of current magnitudes through said pair of terminals.

19. The reactor of claim 18 wherein said current matching means comprises:

a pair of balanced reactive elements connected across said secondary winding;

means for varying a reactance of one of said pair of balanced reactive elements in proportion to a current magnitude difference between said pair of terminals.

20. The reactor of claim 19 wherein said pair of balanced reactive elements comprises a pair of capacitors connected in series between said pair of terminals and a ground tap connected between said pair of capacitors.

21. The reactor of claim 19 wherein said means for varying comprises:

a pair of current sensors for sensing current flow through said pair of terminals respectively;

differential amplifier means for producing an output signal proportional to a difference in magnitude of outputs of said pair of current sensors; and a reactance controlling link responsive to an output of said differential amplifier means and coupled to said one reactive element for varying the reactance thereof.

22. A plasma reactor for processing a semiconductor substrate within a reactor chamber with a process gas from which a plasma has been formed in the chamber by electromagnetic excitation, comprising:

a sputter target in the chamber, at least the surface of said sputter target including additive material for the plasma; and a sputter excitation electrode, the sputter excitation electrode having plural conductive segments separated by apertures therebetween; and an RF source for applying plural RF signals of different respective phases to respective ones of said segments.

23. The reactor of claim 22 wherein said sputter target overlies the substrate and wherein said sputter excitation electrode overlies the target surface.

24. The reactor of claim 22 further comprising a gas inlet for introducing a process gas comprising an etchant and wherein said target surface comprises an etch passivation material.

25. The reactor of claim 24 wherein said etchant comprises a halogen gas and wherein said etch passivation material comprises one of a class of oxygen-containing materials, said class including silicon dioxide.

26. The reactor of claim 22 wherein said segments are arranged symmetrically with respect to an axis of symmetry of said chamber, and wherein said RF source applies RF signals of different phases to each pair of segments on opposite sides of said axis whereby to reduce penetration of capacitive coupling beyond said target.

27. The reactor of claim 26 wherein there are only two RF signals and said two RF signals have opposite phases, and wherein said RF source applies RF signals of opposite phase to each said pair of segments on opposite sides of said axis.

28. The reactor of claim 26 wherein:

said chamber comprises a dome-shaped ceiling;

said sputter excitation electrode is adjacent said ceiling; and said axis is an axis of symmetry of said dome.

29. The reactor of claim 26 further comprising:

current matching means for approximately maintaining equal and opposite currents to the respective segments of said pairs of segments on opposite sides of said axis.

30. The reactor of claim 29 wherein said RF source comprises a transformer comprising a primary winding receiving RF power and a secondary winding having different taps providing said RF signals of different phases.

31. The reactor of claim 30 wherein said current matching means comprises:

plural balanced reactive elements connected across pairs of said taps on said secondary winding;

means for varying a reactance of one of said balanced reactive elements in proportion to a current magnitude difference between respective ones of said taps.

32. The reactor of claim 31 wherein said balanced reactive elements comprise capacitors connected across said taps.

33. The reactor of claim 32 wherein there are only two taps, said two taps comprising respective ends of said secondary winding whereby to provide only RF signals of opposite phases, and wherein said balanced reactive elements comprise two reactive elements connected across said ends of said secondary winding.

34. The reactor of claim 32 wherein said means for varying comprises:

plural current sensors for sensing current flow through said plural taps;

differential amplifier means for producing an output signal proportional to a difference in magnitude of outputs of taps; and reactance controlling linkage responsive to an output of said differential amplifier means and coupled to at least a corresponding reactive element for varying the reactance thereof.

* * * * *